United States Patent [19]
Myers et al.

[11] Patent Number: 5,482,200
[45] Date of Patent: Jan. 9, 1996

[54] METHOD FOR APPLYING SOLDER TO A FINE PITCH FLIP CHIP PATTERN

[75] Inventors: Bruce A. Myers; Ronnie J. Runyon, both of Kokomo, Ind.

[73] Assignee: Delco Electronics Corporation, Kokomo, Ind.

[21] Appl. No.: 200,038

[22] Filed: Feb. 22, 1994

[51] Int. Cl.$^6$ ............................. B23K 1/018; B23K 31/02
[52] U.S. Cl. ............................................. 228/191; 228/254
[58] Field of Search ................................... 228/191, 264, 228/180.22, 254

[56] References Cited

U.S. PATENT DOCUMENTS

| | | | |
|---|---|---|---|
| 4,494,688 | 1/1986 | Hatada et al. | 228/180.22 |
| 4,552,300 | 11/1985 | Zovko et al. | 228/264 |
| 4,898,320 | 2/1990 | Dunaway et al. | 228/254 |
| 5,323,947 | 6/1994 | Juskey et al. | 228/180.22 |
| 5,438,749 | 8/1995 | Runyon | 29/825 |

Primary Examiner—P. Austin Bradley
Assistant Examiner—Jeffrey T. Knapp
Attorney, Agent, or Firm—Mark A. Navarre

[57] ABSTRACT

A method is provided for applying solder to a flip chip pattern on a circuit board. The method involves forming solder bumps on a chip, and then transferring the solder bumps to the flip chip pattern by soldering the chip to the flip chip pattern, and then gradually heating the solder bumps while applying a force to separate the chip from the circuit board, such that the solder bumps substantially remain adhered to the flip chip pattern. The solder is transferred to the flip chip pattern in order to allow a flexible circuit interconnect to be soldered to the flip chip pattern for the purpose of establishing electronic communications between the circuit board's electronic circuit components and a microprocessor emulator. The electronic circuit can then be evaluated and tested without a microprocessor chip being present on the substrate.

2 Claims, 2 Drawing Sheets

METHOD FOR APPLYING SOLDER TO A FINE PITCH FLIP CHIP PATTERN

The present invention generally relates to solder deposition techniques. More particularly, this invention relates to a method for soldering a flexible circuit interconnect device to a flip chip conductor pattern on an appropriate substrate, so as to permit the interconnect device to be interconnected to a microprocessor emulator for the purpose of evaluating and testing of other circuit devices on the board without a flip chip microprocessor being physically present on the circuit board.

BACKGROUND OF THE INVENTION

As is well known in the art, microprocessors are large scale integrated circuit devices. A microprocessor chip may contain the control unit, central processing circuitry, and arithmetic and logic circuitry for a computer, permitting its use as a single-chip computer component. As such, microprocessors generally constitute the primary computer element for a computer. Numerous circuit devices are necessary to assist the microprocessor in its function, such as memory chips (RAM and ROM), input-output chips, as well as conventional electrical devices such as diodes, capacitors, inductors and resistors. However, the microprocessor chip will typically be the most expensive single device on a circuit board.

Microprocessor chips are typically soldered to their circuit board, such as a ceramic substrate or printed circuit board. Due to the numerous functions performed by microprocessors, a relatively large number of terminals are required. The size of a typical microprocessor chip is generally on the order of a few millimeters per side, making it somewhat difficult to mount a microprocessor chip to its circuit board. A conventional method adopted by the industry is the flip-chip bonding process. This process utilizes a microprocessor chip referred to as a flip chip, which is generally a monolithic semiconductor device having bead-like terminals provided on one face of the chip. The terminals serve as connections between the microprocessor chip and a suitable conductor pattern formed on the circuit board. Flip chip conductor patterns are typically composed of numerous individual conductors, often as small as about 0.15 millimeter in width, and spaced as little as about 0.2 millimeter apart (i.e., a pitch of about 0.2 millimeter). As a result, soldering a microprocessor flip chip to its conductor pattern requires a significant degree of precision. For this purpose, the terminals are typically formed by using a thick film stencil which selectively prints solder paste on the lower surface of the flip chip in a pattern which is complementary to the conductor pattern on the circuit board. After the stencil is removed, the solder paste is reflowed to form solder bumps by which the flip chip can be reflow soldered to the conductor pattern.

Generally, early in the development of a microprocessor-based product which uses a microprocessor flip chip, the software code required for the fabrication of the production flip chip is not yet established. Consequently, for development purposes the production flip chip's software is typically simulated with a microprocessor emulator, such as a programmable, prepackaged integrated circuit. To do so, a substrate designer is required to design an engineering development unit with an integrated circuit socket mounted to the unit's substrate. A programmable, prepackaged integrated circuit can then be inserted into the socket, by which simulations can be performed for software development. unfortunately, integrated circuit sockets are generally many times larger than a microprocessor flip chip, such that the engineering development unit is required to be much larger than the eventual production unit. Consequently, after the software code has been established, the substrate designer must then specially design a substrate for the production unit, which will utilize the microprocessor flip chip that dictates the production unit's conductor pattern.

Accordingly, a shortcoming of conventional development processes is the requirement that two separate substrates must be designed for a single microprocessor-based product. Such a requirement adds significantly to the time required to arrive at a final production design for the product. Furthermore, the mounting features of an integrated circuit package which incorporates the product, as well as the mounting site within its ultimate working environment, cannot be determined until the size of the final production unit has been established. As a result, the final implementation of the product is further delayed until such considerations have been resolved.

As a solution to the above difficulties, U.S. patent application Ser. No. 08/114861, filed Sep. 2, 1993 and now U.S. Pat. No. 5,438,749, assigned to the assignee of the present invention, teaches a method by which an electronic circuit board that employs a microprocessor flip chip can be developed without the requirement that a development unit be specially designed to accommodate an integrated circuit socket. The method involves the use of a flexible circuit interconnect which can be mated directly with a conductor pattern that is specifically patterned for a circuit board's production flip chip. The production flip chip's conductor pattern is formed on the substrate of an engineering development unit, and the flexible circuit interconnect is registered and soldered to the conductor pattern. The flexible circuit interconnect can then be connected to a microprocessor emulator so as to simulate a microprocessor for the engineering unit, while various development tests and/or evaluations are performed. As a result, there is no requirement to design the engineering unit around an integrated circuit socket, as required in the past, for the purpose of testing and evaluating an engineering unit. Instead, the engineering unit can be designed to accommodate the production flip chip and its conductor pattern, such that a single substrate design can be developed for use in both the engineering development unit and the final production units.

While the method taught by the above-referenced U.S. Ser. No. 08/114,861 can be readily practiced for numerous applications, difficulty is encountered when attempting to solder the flexible circuit interconnect to a conductor pattern whose conductors are spaced less than about 0.35 millimeter apart. The difficulty arises in the use of a thick film stencil for selectively printing solder paste on each of the conductors, thick film or printed, which form the conductor pattern. If the spacing between conductors is less than about 0.35 millimeters, the solder tends to bridge adjacent conductors during reflow in which the solder paste is melted to form the solder bumps with which the flexible circuit interconnect is soldered to the conductor pattern. The resulting electrical shorting renders the screen printing technique unsuitable for the unique test and evaluation method taught by the above-referenced U.S. Ser. No. 08/114,861

Accordingly, what is needed is a method by which the flexible circuit interconnect taught by the above-referenced U.S. Ser. No. 08/114,861 can be more reliably soldered to a conductor pattern on a substrate, particularly when the spacing between conductors is less than about 0.35 millimeters. More specifically, it would be desirable if such a method were able to precisely form a solder bump on each of the conductors of a flip chip conductor pattern, such that the flexible circuit interconnect could be readily reflow soldered to the conductor pattern.

SUMMARY OF THE INVENTION

It is an object of this invention to provide a method for connecting a communications interconnect device to a flip chip conductor pattern on a circuit board, such that a reliable and durable electrical connection is achieved.

It is another object of this invention to provide a method which enables solder bumps to be formed on a flip chip conductor pattern having individual conductors spaced less than about 0.35 millimeter apart.

It is yet another object of this invention to provide a method by which a microprocessor-based electronic product can be developed without the requirement that a development unit be specially designed to accommodate an integrated circuit socket to serve as a means for emulating a microprocessor during development testing.

It is a further object of this invention to provide a method by which the communications interconnect device can be used to place a flip chip conductor pattern of a circuit board in communication with a microprocessor emulator.

In accordance with a preferred embodiment of this invention, these and other objects and advantages are accomplished as follows.

According to the present invention, there is provided a method by which an interconnect device can be reliably soldered to a conductor pattern on a substrate, so as to enable the creation of a communications path between the substrate's electronic circuitry and a microprocessor emulator. As a result, the microprocessor emulator can be used to evaluate and test the electronic circuitry without a microprocessor flip chip being present on the board. More particularly, the method of this invention enables the precise deposition of solder on the conductor pattern, such that the interconnect device can be soldered to the conductor pattern even in applications in which the individual conductors of the conductor pattern are spaced less than about 0.35 millimeter apart. The method is specifically adapted to accommodate extremely small and intricate flip chip conductor patterns, so as to achieve a reliable communication path between a microprocessor flip chip emulator and a circuit board.

Generally, an interconnect device suitable for use with the method of this invention includes a flexible substrate having an interconnect end and an oppositely disposed end to which an emulator can be connected. A number of conductors are supported by the flexible substrate, and extend its entire length. The number of conductors will preferably correspond to the number of circuit conductors which constitute the microprocessor conductor pattern on the circuit board. The conductors of the flexible interconnect device each terminate with a cantilevered portion, or conductor finger, which extends beyond the flexible substrate. The conductor fingers form a complementary conductor pattern to the microprocessor conductor pattern on the electronic circuit.

The complementary conductor pattern is configured such that, upon being mated with the conductor pattern on the circuit board, each of the conductor fingers will be in electrical communication with a corresponding one of the circuit conductors of the microprocessor conductor pattern. A device which is capable of emulating a microprocessor, such as an erasable, programmable read only memory (EPROM) device, can then be connected to the interconnect device using any suitable device, such as a leaded, packaged integrated circuit socket or a male/female connector.

The method by which the flexible interconnect device is soldered to the conductor pattern on the circuit board results in a reliable communications path between the emulator and the circuit board. More specifically, electrical shorts between adjacent conductors of the conductor pattern are avoided, even when the spacing between adjacent conductors is less than about 0.35 millimeter. The integrity of the resulting solder joint is such that the flexible interconnect device and circuit board can be readily handled as a unit without premature fatiguing or otherwise breaking of the conductor fingers of the interconnect device.

The soldering process includes the use of a chip, such as a flip chip, on which solder bumps have been formed in accordance with conventional processing methods. The chip can be an electrical reject from a wafer of the flip chips normally mounted to the substrate for the circuit board's production design, or can be a "dummy" chip designed specifically for the method of this invention. After being properly registered with the conductor pattern, the chip is reflow soldered to the substrate using conventional production techniques. The chip is then removed such that the solder bumps are substantially transferred to the conductor pattern on the substrate.

The flexible interconnect device's complementary conductor pattern can then be registered with the conductor pattern on the circuit board, such that the individual conductor fingers are precisely aligned with the individual conductors of the conductor pattern. A suitable reflow soldering device is then brought into engagement with the conductor fingers, and soldering is performed such that reliable continuity between mating conductors is assured, while inadvertent contact between adjacent conductors is avoided so as to alleviate electrical shorting.

Using the method of this invention, solder bumps which have previously been precisely formed on the chip are readily transferred to the conductor pattern, alleviating the prior art requirement of screen printing a solder paste directly onto the conductor pattern. As such, greater accuracy is achieved in the placement of the solder bumps on the conductor pattern, thereby making it possible to form solder bumps on a conductor pattern whose pitch is less than about 0.35 millimeter. The flexible interconnect device can then be used to test the circuit board and its associated electronic components without requiring an integrated circuit socket to be physically present on the board. Accordingly, an electronic circuit board which employs a microprocessor flip chip can be designed to incorporate the conductor pattern for the application's production flip chip, instead of being specially designed to accommodate an integrated circuit socket that is necessary only for development purposes. As a result, a single substrate can be designed for both the development unit and the final production units, so as to save time and materials during the development of the microprocessor-based product.

in addition, because a microprocessor is not present on the circuit board, the failure of the circuit board during testing results only in the scrappage of the board and its components, and not a microprocessor chip. As a result, potentially significant savings can be realized by avoiding the scrappage of presumably faultless microprocessor chips during development testing. The interconnect device can also be adapted for use with production diagnostics and hot testing of circuit boards.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings wherein.

DETAILED DESCRIPTION OF THE INVENTION

A method is provided for precisely applying solder to a flip chip pattern on a substrate. The solder is deposited on the flip chip pattern in order to reflow solder a flexible circuit interconnect to the flip chip pattern for the purpose of establishing electronic communications between the electronic circuit components of the substrate and a microprocessor emulator. The electronic circuit can then be evaluated and tested without requiring a microprocessor chip to be present on the substrate. The method serves to electrically connect the flexible circuit interconnect to the individual conductors which form the flip chip pattern on the substrate for a production microprocessor flip chip.

Figure 1:
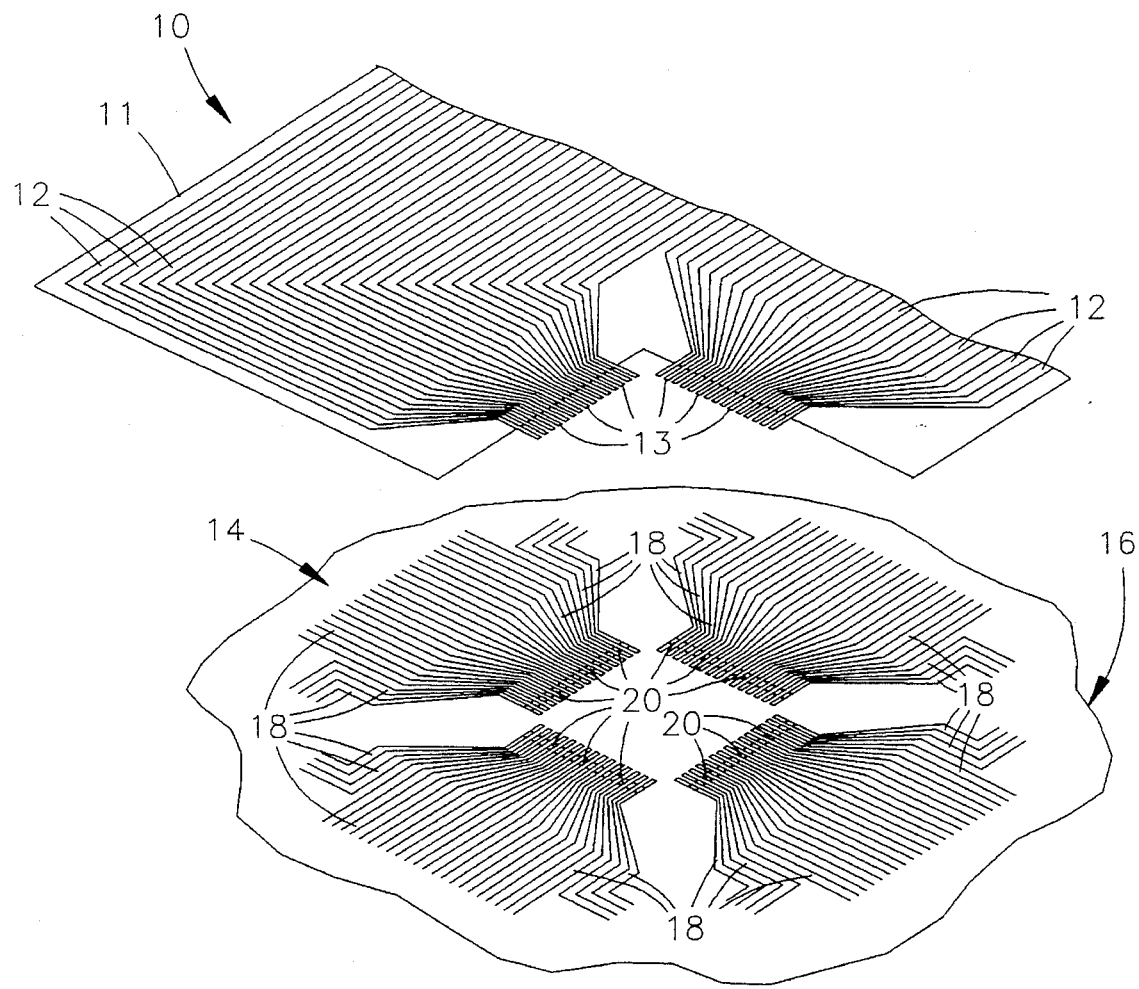
FIG. 1 shows, in perspective, a flip chip microprocessor conductor pattern formed on the surface of a circuit board, and a flexible circuit interconnect in accordance with this invention.

Referring to FIG. 1, a flexible circuit interconnect 10 is shown which is suitable for use with the method of this invention. The circuit interconnect 10 is illustrated as being aligned with two sides of a flip chip conductor pattern 14 formed on the surface of a substrate 16, as is known in the art. In accordance with a preferred aspect of this invention, the substrate 16 is an engineering development unit for a microprocessor-based product. As is conventional, the substrate 16 may be a ceramic substrate or a printed circuit board. The conductor pattern 14 is composed of a number of individual conductors 18 which are sized and spaced so as to mate with the microprocessor flip chip to be used in the production version of the particular product. Accordingly, the conductors 18 may be as narrow as about 0.15 millimeter in width, with a spacing between adjacent conductors 18 of about 0.2 millimeter, or possibly less.

For illustrative purposes, the circuit interconnect 10 is shown in FIG. 1 as being adapted to interconnect with only two series of conductors 18 of the conductor pattern 14. However, those skilled in the art will recognize that the interconnect device will preferably communicate with all of the conductors 18 of the conductor pattern 14. The circuit interconnect 10 is shown as a flexible flat cable which includes a flexible insulating base substrate 11 on which a number of parallel conductors 12 are supported. The substrate 11 may be of any suitable material, such as a polyimide or mylar film for example, and formed with or without cover layers. The circuit interconnect 10 may be single or double sided, multi-layered or rigidized, in addition to other possible arrangements. The circuit interconnect 10 has oppositely disposed ends, one of which terminates with the conductors 12 being cantilevered beyond the substrate 11, so as to form a corresponding number of conductor fingers 13.

The opposite end of the circuit interconnect 10 can be adapted to be fitted with a suitable connector depending on the particular application, such as a male/female connector, or a leaded packaged integrated circuit socket for a programmable prepackaged integrated circuit, as well as other configurations.

The conductors 12 may be formed on the substrate 11 by several methods, such as by laminating copper foil to any of several base substrate materials, or, alternatively, by selectively pattern plating copper directly onto the substrate 11. Preferably, the conductor finger 13 for each conductor 12 is plated with gold or pre-tinned with a suitable tin-lead alloy so as to enhance the solderability of the conductor fingers 13 to the conductors 18 of the conductor pattern 14. The conductor fingers 13 are arranged such that they form a pattern which is complementary to the conductor pattern 14 formed on the substrate 16, and such that each conductor finger 13 will appropriately mate with a corresponding conductor 18 of the conductor pattern 14. Consequently, the width and spacing of the conductor fingers 13 must also roughly agree with the above values stated for the conductors 18. The length of the conductor fingers 13, corresponding to the distance each conductor 12 is cantilevered beyond the end of the substrate 11, is preferably about 0.6 to about 0.8 millimeter. These dimensions may vary widely depending on the particular application.

As can be seen from FIG. 1, the relatively small dimensions of and spacing between the individual conductor fingers 13 and conductors 18 necessitates an extremely intricate bonding process. Specifically, the bonding process must ensure that each pair of conductors 18 and conductor fingers 13 is provided with a sufficient amount of an electrically conductive bonding material so as to form a reliable conduction path. Simultaneously, a minimal amount of bonding material must be used so as to avoid creating an inadvertent electrical short between adjacent pairs of conductor fingers 13 and conductors 18. To afford such control, the bonding material must be precisely deposited onto the individual conductors 18 of the conductor pattern 14.

Figure 2:
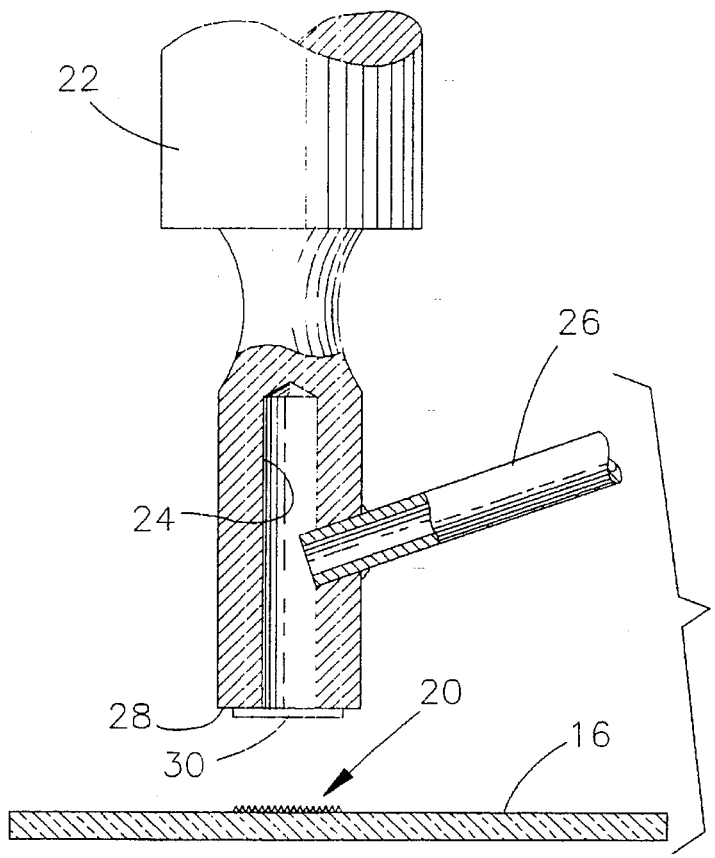
FIG. 2 is a cross-sectional view of the circuit board and a desoldering tool immediately after removal of a chip from the circuit board.

In accordance with this invention, a preferred method for achieving the above requirements entails a solder reflow process in which solder bumps formed on a chip are transferred to the conductor pattern 14, as represented in FIG. 2. In a process which is conventional with flip chip processing, solder bumps are formed on a lower surface of a chip 30, which may be an electrical reject from a silicon wafer of the flip chips normally mounted to the substrate 16 in a production design, r can be a "dummy" chip designed specifically for the method of this invention. The solder bumps 20 are formed on a surface of the flip chip 30 using any one of a number of conventional techniques, such as electrodeposition or screen printing of solder paste followed by reflow. Suitable solder alloys include tin-lead alloys containing about 10 to about 60 percent tin, indium-lead alloys containing about 10 to about 60 percent indium, and indium-lead-silver alloys containing about 10 to about 60 percent indium and up to about 5 percent silver. An appropriate amount of solder paste is precisely deposited onto the chip 30 in accordance with the spacing of the conductors 18 of the conductor pattern 14. The solder paste is then heated to a temperature and for a duration which is sufficient to melt the solder alloy, such that the resulting solder bumps are appropriately formed on the surface of the chip 30. Once the solder bumps have resolidified, the chip 30 is mounted to the conductor pattern 14 by registering the solder bumps with the individual conductors 18, and then reflow soldering in accordance with known methods.

Transfer of the solder bumps to the conductor pattern 14 is then achieved by removing the chip 30 from the substrate 16, as represented in FIG. 2. A preferred technique for this step utilizes a specially designed desoldering tool which is generally composed of a solder iron 22 having a thermal head equipped with a vacuum chamber 24. A nipple 26 is mounted to the thermal head in order to allow a vacuum to be drawn within the vacuum chamber 24 with any suitable vacuum pump. The vacuum chamber 24 is exposed to the lower surface 28 of the thermal head, allowing a vacuum to be created within the vacuum chamber 24 when the lower surface 28 of the thermal head is abutted against the upper surface of the chip 30. In doing so, the chip 30 can be separated from the substrate 16 by applying an upward force to the chip 30 with the solder iron 22 while the solder iron 22 is being heated. More specifically, it is preferable that sufficient heat and force be applied such that the chip 30 will separate from its solder bumps upon the solder alloy in immediate contact with the chip 30 becoming molten. As such, the majority of the solder bump will remain on the conductor pattern 14, while only a small amount of solder alloy will remain on the lower surface of the chip 30. The solder alloy which remains on the conductor pattern 14 will be in the form of discrete solder bumps 20, substantially in the same form as they were created on the lower surface of the chip 30.

Figure 3:
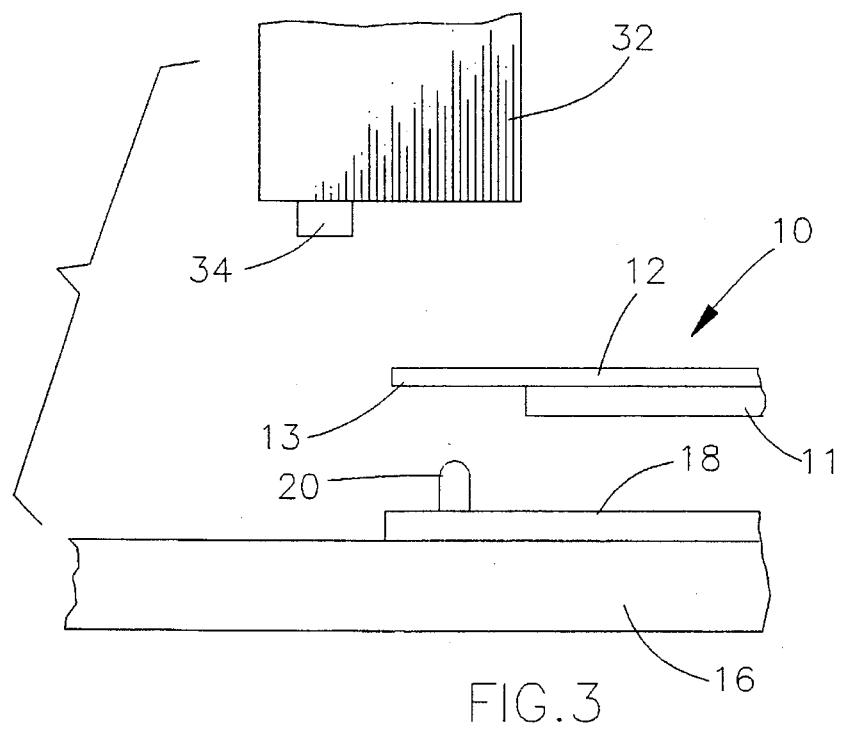
FIG. 3 is a cross-sectional view of the circuit board immediately prior to the flexible circuit interconnect device being reflow soldered to the circuit board.

The circuit interconnect 10 can then be positioned over the conductor pattern 14 and reflow soldered to the conductors 18. Prior to reflow, the solder bumps 20 are preferably treated with a flux to promote the soldering of the circuit interconnect 10 with the conductors 18 of the conductor pattern 14. Because of the extremely intricate and delicate nature of the conductor fingers 13 and the conductors 18, a microscope may be used to accurately register the circuit interconnect 10 with the conductor pattern 14. As illustrated in FIG. 3, once the circuit interconnect 10 is properly aligned, a hot bar reflow device, such as a thermode 32, is brought into engagement with the conductor fingers 13, such that each conductor finger 13 contacts its corresponding conductor 18 on the conductor pattern 14. The thermode 32 then heats the conductor fingers 13 and the solder bumps 20 so as to reflow the solder bumps 20 and metallurgically bond the conductor fingers 13 to their respective conductors 18.

A suitable reflow temperature cycle involves preheating the thermode 32 to a temperature of about 275° C. for about 6 seconds, ramping the temperature up to about 450° C. over a period of about 25 seconds, maintaining this temperature for about 10 seconds so as to reflow the solder bumps 20 and metallurgically bond the conductor fingers 13 to their respective conductors 18, and then cooling the thermode 32 to a temperature of about 130° C. While the above reflow cycle has been found to achieve suitable results, those skilled in the art will recognize that a preferred temperature cycle for a given application will depend at least in part on the size of the substrate 16, as well as other factors. Accordingly, the actual temperatures and durations employed during the reflow process when practicing this invention may vary significantly from those provided above.

To limit the amount of solder which will extrude from beneath the conductor fingers 13, a stand-off 34 is provided on the lower surface of the thermode 32. For the conductor pattern geometry described above, the stand-off 34 preferably projects about 0.1 millimeter below the lower surface of the thermode 32, such that the resulting solder joint has a vertical height of about 0.02 to about 0.1 millimeter, preferably about 0.25 to about 0.75 millimeter, so as to create a reliable solder joint without electrical shorting between closely spaced joints. An epoxy is then deposited over the conductor fingers 13 for additional mechanical strength. As a result, the potential for premature fatiguing due to thermal cycles, or otherwise breaking of the conductor fingers 13 when the circuit interconnect 10 and the substrate 16 are handled, is significantly reduced.

once interconnected in accordance with the above method, the flexible circuit interconnect 10 can be connected to a suitable microprocessor emulator, such as a programmable prepackaged integrated circuit (not shown), with a connector. Standard developmental testing can then be performed on the substrate 16.

From the above, it can be seen that a significant advantage of this invention is that the use of a chip 30 to transfer solder to the conductor pattern 14 greatly enhances the accuracy and precision by which solder bumps 20 are formed on the individual conductors 18. More specifically, solder bumps 20 can be readily formed on a conductor pattern 14 having a conductor pitch of less than 0.35 millimeter, a capability not possible with known screen printing techniques currently available. The method of this invention is highly suitable for forming solder bumps 20 that are compatible with the finest pitch flip chips and conductor patterns that are currently produced, which generally have a conductor pitch of about 0.2 millimeter, and possibly less.

More generally, an advantage of this invention is the ability to conduct evaluations and tests on an electronic circuitry without the requirement for a microprocessor flip chip being present in the circuit. Consequently, a circuit board can be designed to incorporate a conductor pattern for a production flip chip, instead of being specially designed to accommodate an integrated circuit socket that is necessary for development purposes only. Accordingly, a single circuit board can be designed for use in engineering development and production, resulting in a significant savings in time and materials during the development of the product, up to and including final implementation of the product.

While our invention has been described in terms of a preferred embodiment, it is apparent that other forms could be adopted by one skilled in the art-for example, by using different deposition techniques for initially forming the solder bumps on the chip 30, or the use of a different desoldering device for removing the chip 30 from the circuit board, or by substituting appropriate materials, or by utilizing the teachings of this invention for alternative purposes. Accordingly, the scope of our invention is to be limited only by the following claims.

The embodiments of the invention in which an exclusive property or privilege is claimed are defined as follows:

1. A method for soldering a flexible circuit to a flip chip conductor pattern formed on a rigid electronic circuit board, said method comprising the steps of:

providing a plurality of circuit conductors on said electronic circuit board so as to define said flip chip conductor pattern;

forming solder bumps on a surface of a flip chip and registering each of said solder bumps with a corresponding one of said plurality of circuit conductors;

reflowing said solder bumps to solder said chip to said flip chip conductor pattern;

heating said flip chip while simultaneously applying a force to separate said flip chip from said flip chip conductor pattern, thereby to remove said flip chip from said solder bumps, and to transfer said solder bumps to said plurality of circuit conductors;

registering said flexible circuit with said conductor pattern such that a plurality of conductors extending from said flexible circuit register with said plurality of circuit conductors; and heating said plurality of conductors so as to solder said flexible circuit to said flip chip conductor pattern.

2. A method as recited in claim 1 further comprising the step of depositing a solder paste on said flip chip prior to said step of reflowing said solder bumps.

* * * * *